(12) United States Patent
Hong et al.

(10) Patent No.: US 8,791,515 B2
(45) Date of Patent: Jul. 29, 2014

(54) SPIN FIELD EFFECT LOGIC DEVICES

(71) Applicant: Samsung Electronics Co., Ltd., Suwon-Si (KR)

(72) Inventors: Ki-ha Hong, Seoul (KR); Jong-seob Kim, Suwon-si (KR); Jai-Kwang Shin, Anyang-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 13/915,272

(22) Filed: Jun. 11, 2013

(65) Prior Publication Data
US 2013/0277722 A1 Oct. 24, 2013

Related U.S. Application Data

(62) Division of application No. 12/654,349, filed on Dec. 17, 2009, now Pat. No. 8,487,358.

(30) Foreign Application Priority Data

Jan. 13, 2009 (KR) .................. 10-2009-0002719

(51) Int. Cl.
- H01L 29/66 (2006.01)
- H01L 29/82 (2006.01)
- H01L 29/94 (2006.01)

(52) U.S. Cl.
USPC .......................................................... 257/295

(58) Field of Classification Search
CPC ................................................. H01L 29/66984
USPC .......................................................... 257/295
See application file for complete search history.

(56) References Cited

U.S. PATENT DOCUMENTS

| 7,315,041 B2 | 1/2008 | Fong et al. |
| 7,411,235 B2 | 8/2008 | Saito et al. |
| 7,602,636 B2 | 10/2009 | Saito et al. |
| 7,936,028 B2 * | 5/2011 | Hong et al. .................. 257/421 |
| 2005/0282379 A1 * | 12/2005 | Saito et al. .................. 438/624 |
| 2006/0017080 A1 | 1/2006 | Tanaka et al. |
| 2008/0061332 A1 | 3/2008 | Saito et al. |

FOREIGN PATENT DOCUMENTS

| CN | 1713400 A | 12/2005 |
| CN | 1768427 A | 5/2006 |
| JP | 2008-066596 A | 3/2008 |
| KR | 10-2004-0081625 | 9/2004 |

(Continued)

OTHER PUBLICATIONS

R. Richter, et al., "Nonvolatile field programmable spin-logic for reconfigurable computing", Applied Physics Letter, vol. 80, pp. 1291-1293, (2002).

(Continued)

*Primary Examiner* — Ha Tran T Nguyen
*Assistant Examiner* — Raj R Gupta
(74) *Attorney, Agent, or Firm* — Harness, Dickey & Pierce, P.L.C.

(57) ABSTRACT

Provided are spin field effect logic devices, the logic devices including: a gate electrode; a channel formed of a magnetic material above the gate electrode to selectively transmit spin-polarized electrons; a source on the channel; and a drain and an output electrode on the channel outputting electrons transmitted from the source. The gate electrode may control a magnetization state of the channel in order to selectively transmit the electrons injected from the source to the channel.

5 Claims, 15 Drawing Sheets

(56) References Cited

FOREIGN PATENT DOCUMENTS

| KR | 10-2005-0116839 | 12/2005 |
|---|---|---|
| KR | 10-2006-0048384 | 5/2006 |
| WO | WO-2006/100835 A1 | 9/2006 |

OTHER PUBLICATIONS

A. Ney, et al, "Programmable computing with a single magnetoresistive element", Nature, vol. 425, pp. 485-487, Oct. 2, 2003.

H. Dery, et al., "Spin-based logic in semiconductors for reconfigurable large-scale circuits", Nature, vol. 447, pp. 573-576, May 31, 2007.

M. Tanaka, et al., "MOS-Based Spin Devices for Reconfigurable Logic", IEEE Transactions on Electron Devices, vol. 54, No. 5, May 2007.

Van Dijken, et al., "Room temperature operation of a high output current magnetic tunnel transistor", Applied Physics Letters, Lett. 80, pp. 3364-3366, (2002).

Claudia Felser, et al., "Spintronics: A Challenge for Materials Science and Solid-State Chemistry", Angewandte Chemie, Int. Ed., pp. 668-699 (2006).

W.H. Butler, et al., "Spin-dependent tunneling conductance of Fe | MgO | Fe sandwiches", Physical Review B, vol. 63, Jan. 8, 2001.

J. Mathon, et al., "Theory of tunneling magnetoresistance of an epitaxial Fe/MgO/Fe(001) junction", Physical Review B, vol. 63, May 10, 2001.

Chinese Office Action dated Jul. 16, 2013 in corresponding application No. 201010003917.9.

Japanese Office Action issued in corresponding Japanese Application No. 2010-004344 on Feb. 12, 2014 and English-language translation.

\* cited by examiner

| $V_{input}$ | $V_{output}$ |
|---|---|
| $V_{th}(V_{high})$ | $I_{low}(V_{low})$ |
| $V_0(V_{low})$ | $I_{high}(V_{high})$ |

| $V_{input\ 1}$ | $V_{input\ 2}$ | $V_{output}$ |
|---|---|---|
| $V_0\ (V_{low})$ | $V_0\ (V_{ow})$ | $I_{high}(V_{high})$ |
| $V_{th1}(V_{high})$ | $V_0\ (V_{ow})$ | $I_{high}(V_{high})$ |
| $V_0\ (V_{low})$ | $V_{th2}(V_{high})$ | $I_{high}(V_{high})$ |
| $V_{th1}(V_{high})$ | $V_{th2}(V_{high})$ | $I_{low}(V_{low})$ |

| $V_{input\,1}$ | $V_{input\,2}$ | $V_{output}$ |
|---|---|---|
| $V_0\,(V_{low})$ | $V_0\,(V_{low})$ | $I_{low}\,(V_{low})$ |
| $V_{th1}\,(V_{high})$ | $V_0\,(V_{low})$ | $I_{low}\,(V_{low})$ |
| $V_0\,(V_{low})$ | $V_{th2}\,(V_{high})$ | $I_{low}\,(V_{low})$ |
| $V_{th1}\,(V_{high})$ | $V_{th2}\,(V_{high})$ | $I_{high}\,(V_{high})$ |

| V input 1 | V input 2 | V output |
|---|---|---|
| $V_0$ ($V_{low}$) | $V_0$ ($V_{low}$) | $I_{high}$ ($V_{high}$) |
| $V_{th1}$ ($V_{high}$) | $V_0$ ($V_{low}$) | $I_{low}$ ($V_{low}$) |
| $V_0$ ($V_{low}$) | $V_{th2}$ ($V_{high}$) | $I_{low}$ ($V_{low}$) |
| $V_{th1}$ ($V_{high}$) | $V_{th2}$ ($V_{high}$) | $I_{low}$ ($V_{low}$) |

SPIN FIELD EFFECT LOGIC DEVICES

CROSS-REFERENCE TO RELATED APPLICATION(S)

This application is a divisional application of U.S. application Ser. No. 12/654,349, filed Dec. 17, 2009, which claims priority under 35 U.S.C. §119 to Korean Patent Application No. 10-2009-0002719 filed on Jan. 13, 2009 in the Korean Intellectual Property Office (KIPO). The entire contents of each of the above-mentioned applications are incorporated herein by reference.

BACKGROUND

1. Field

One or more example embodiments relate to electron spin field effect logic devices.

2. Description of the Related Art

When semiconductor devices are fabricated in nano-scale, an increasing rate of carrier mobility cannot keep up with the degree of device integration (e.g., the number of devices), and thus, power demand does not decrease despite a reduction in device size. In order to address the above problem, technology using electron spin has been suggested.

A spin transistor is a device that operates by moving electrons based on spin-polarization. Power consumption for moving the electrons may be small and a turn-on speed may be high. A spin transistor may, for example, include a source and drain on a channel, separated by a gate. The spin transistor may be configured to transmit electrons having a spin polarization between the source and drain based on whether or not a field effect is present in the channel. A field effect may modulate the amount of spin-polarized current detected at the drain.

Conventional logic circuits using transistors require a large number of transistors and have a complex structure. When a logic device using a spin field effect is fabricated, the logic device may have a different, simpler structure and the number of components in a logic circuit may be reduced relative to conventional logic circuits.

SUMMARY

One or more example embodiments include spin field effect logic devices.

One or more example embodiments may include a logic device using a spin field effect, the logic circuit device including: a channel including a magnetic material configured to selectively transmit spin-polarized electrons; a source on the channel; a gate electrode on the channel; a drain electrode configured to output electrons transmitted from the source; an output electrode configured to output electrons transmitted from the source.

The gate electrode may be configured to control a magnetization state of the channel in order to selectively transmit electrons injected from the source into the channel, the channel may be configured to selectively transmit the spin-polarized electrons which are spin-polarized in a first direction when the channel is in a first magnetization state, and the drain and the output electrode may include a magnetic material, wherein the drain may be magnetized in a second direction and the output electrode may be magnetized in the first direction. The logic device may further include a tunnel barrier on the channel, wherein the source, the drain, and the output electrode may be on the tunnel barrier.

The logic device may further include a first tunnel barrier formed on the channel and a second tunnel barrier formed on the channel, wherein two of the source, the drain, and the output electrode may be formed on the first tunnel barrier, and the remainder may be formed on the second tunnel barrier. The channel may be a half-metal and an energy band gap of the channel may be in the first direction. Each of the drain and the output electrode may include a ferromagnetic layer on the tunnel barrier and a metal layer on the ferromagnetic layer. Each of the drain and the output electrode may further include an anti-ferromagnetic layer between the ferromagnetic layer and the metal layer.

An input terminal may be connected to the gate electrode and an output terminal may be connected to the output electrode, and when there is a voltage about equal to or greater than a threshold voltage at the input terminal, the channel may be in a second magnetization state to selectively transmit electrons which are spin-polarized in the second direction, and an output voltage of the output terminal may be low, and when there is a ground voltage at the input terminal, a high voltage of the output electrode may be detected from the output terminal, and the logic circuit device may be an inverter circuit device.

A second channel may be on the channel, and the source may be on the channel and the drain may be on the second channel. A second gate electrode may be on the second channel, the output electrode may be connected between the drain and the first voltage source, and the source and the drain may be magnetized in the first direction, the gate and the second gate electrodes may be configured to control a magnetization state of the channel and the second channel respectively, in order to selectively transmit electrons injected from the source into the channel, and the channel and the second channel may transmit the spin-polarized electrons which are magnetized in a second direction. There may be a first tunnel barrier between the channel and the source, and between the channel and the second channel, and a second tunnel barrier between the second channel and the drain, and between the second channel and the output electrode.

When at least one of the channel and the second channel is magnetized in the second direction, a resistance between the source and the output electrode is a first resistance, when both the channel and the second channel are magnetized in the first direction, the resistance is a second resistance, and a resistance between the first voltage source and the output electrode is a third resistance having a magnitude between that of the first resistance and the second resistance.

The gate electrode and the second gate electrode may be connected to a first input terminal and a second input terminal, the output electrode may be connected to an output terminal, and the logic device may be configured such that when voltages about equal to or greater than corresponding threshold voltages exists at each of the gate electrode and the second gate electrode, the channel and the second channel transmit the electrons spin-polarized in the first direction and a first voltage related to a first current from the source is output at the output terminal, and when a voltage which is smaller than a threshold voltage exists in at least one of the first gate electrode and the second gate electrode, a second voltage related to a second current from the first voltage source may be output, the second voltage may be greater than the first voltage and the logic device may be a NAND circuit device.

According to example embodiments, a second channel and a third channel may be on the channel, the gate electrode on the second channel configured to control a magnetization direction of the second channel, and a second gate electrode on the third channel and configured to control a magnetization direction of the third channel, the drain and a second drain respectively on the second channel and the third channel, the source may be formed on the channel separated from the second channel and the third channel, a first voltage source may be connected to the first drain and a second drain in parallel, and the output electrode may be connected between the first voltage source and the drain.

The logic device may further include a third gate electrode on the channel to control a magnetization direction of the first channel. The first, second, and third channels may be magnetized in the first direction. When at least one of the second channel and the third channel is magnetized in the first direction, a resistance between the source and the output electrode is a first resistance, when both the first channel and the second channel are magnetized in a second direction, the resistance is a second resistance, and a resistance between the first voltage source and the output electrode may have a magnitude between that of the first resistance and the second resistance.

The gate electrode and the second gate electrode may be connected to a first input terminal and a second input terminal, the output electrode may be connected to an output terminal, and the logic device may be configured such that when a potential of the first input terminal and the second input terminal is about greater than or equal to a corresponding threshold voltage, the channel and the second channel may transmit the electrons spin-polarized in the second direction and a first voltage related to a first current from the first voltage source is output at the output terminal, and when at least one of the first input terminal and the second input terminal has a potential which is smaller than the corresponding threshold voltage, a second voltage related to a second current from the source is output at the output terminal, and the first voltage may be greater than the second voltage and the logic device may be an AND logic device.

The first channel may be magnetized in the first direction, and the second and third channels may be magnetized in the second direction that is opposite to the first direction. When at least one of the second channel and the third channel is magnetized in the first direction, a resistance between the source and the output electrode is a first resistance, when both the first channel and the second channel are magnetized in the second direction, the resistance is a second resistance, and a resistance between the first voltage source and the output electrode is a third resistance having a magnitude that may be between that of the first resistance and the second resistance.

The gate electrode and the second gate electrode may be connected to a first input terminal and a second input terminal, respectively, the output electrode may be connected to an output terminal, and the logic device may be configured such that when at least one of the first input terminal and the second input terminal has a potential about greater than or equal to a corresponding threshold voltage, a corresponding channel transmits the electrons spin-polarized in the first direction and the spin electrons input from the source may correspond to a low voltage at the output terminal, and when the first input terminal and the second input terminal have a voltage which is smaller than the corresponding threshold voltage, a current from the first voltage source corresponds to a high voltage at the output terminal, and the logic circuit device may be a NOR circuit device.

Spin field effect logic devices according to example embodiments operate fast and/or at improved speed, and have low and/or improved power consumption. The logic devices may have simple configurations.

BRIEF DESCRIPTION OF THE DRAWINGS

Example embodiments will be more clearly understood from the following brief description taken in conjunction with the accompanying drawings.

FIG. 1 is a cross-sectional diagram of a spin field effect logic device according to an example embodiment;

FIGS. 2-5 are diagrams illustrating driving principles of the logic device shown in FIG. 1;

FIG. 6 is a truth table of the logic device shown in FIG. 1 illustrating inverter characteristics;

FIG. 7 is a cross-sectional diagram of a spin field effect logic device and illustrates inverter operation of the device according to an example embodiment;

FIGS. 8-10 are cross-sectional diagrams of a spin field effect logic device and illustrate NAND operation of the device according to an example embodiment;

FIG. 11 is a truth table of the logic device shown in FIGS. 8-10 illustrating NAND characteristics;

FIGS. 12-14 are perspective diagrams of a spin field effect logic device and illustrate AND operation of the device according to an example embodiment;

FIG. 15 is a truth table of the logic device of FIGS. 12-14 illustrating AND characteristics;

FIGS. 16-18 are perspective diagrams of a spin field effect logic device and illustrate NOR operation of the device according to an example embodiment;

FIG. 19 is a truth table of the logic device of FIGS. 16-18 illustrating NOR characteristics; and FIG. 20 is a perspective diagram of a spin field effect logic device and illustrates AND and NOR operation of the device according to an example embodiment.

Figure 1:
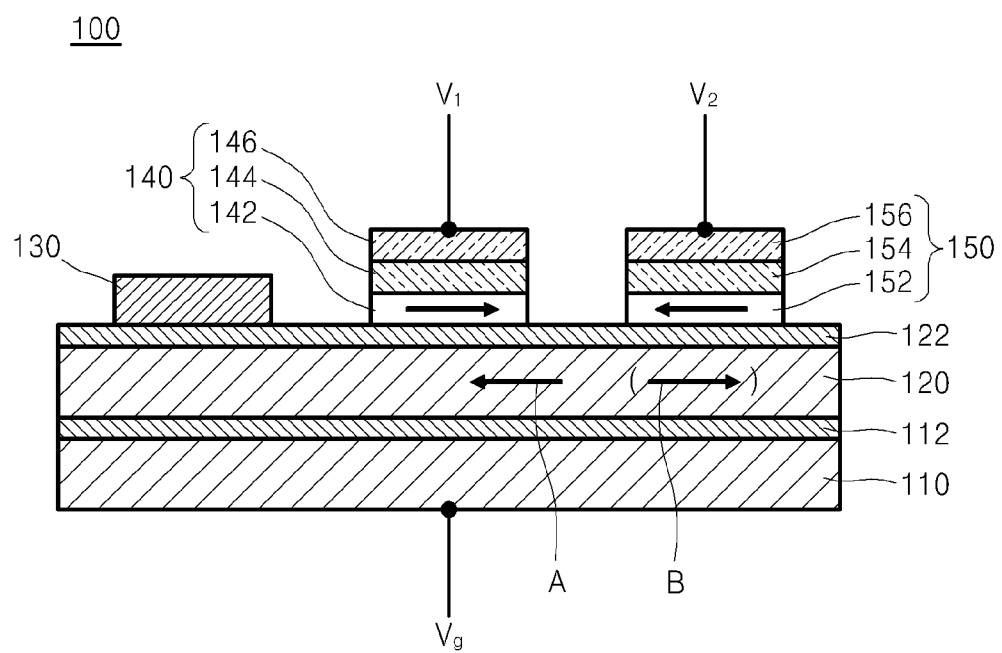
FIGS. 1-20 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram of a spin field effect logic device 100 according to an example embodiment. Referring to FIG. 1, a gate oxide 112 may be on a gate electrode 110, a channel 120 may be on the gate oxide 112, and a tunnel barrier 122 may be on the channel 120. A source 130, a drain 140, and an output electrode 150 may be on the tunnel barrier 122, separated from each other. The gate electrode 110 may be a conductor (e.g., aluminum (Al) and/or polysilicon). The gate oxide 112 may be an oxide (e.g., silicon oxide). The tunnel barrier 122 may be the same material as a material between magnetization layers in a tunneling magneto resistivity (TMR) device. For example, the tunnel barrier 122 may be of MgO or AlOx (e.g., Al2O3).

The source 130 may be a metal layer. When the source 130 is a general metal, densities of state (DOS) of an up-spin electron and a down-spin electron may be about the same. The drain 140 may be a magnetic material, for example, a ferromagnetic material. The drain 140 may include a ferromagnetic layer 142 on the tunnel barrier 122 and a metal layer 146 on the ferromagnetic layer 142. The drain 140 may further include an anti-ferromagnetic layer 144 between the ferromagnetic layer 142 and the metal layer 146. The anti-ferromagnetic layer 144 may fix a spin direction of spin-polarized electrons in the ferromagnetic layer 142. The output electrode 150 may be a magnetic material, for example, a ferromagnetic material. The output electrode 150 may include a ferromagnetic layer 152 on the tunnel barrier 122 and a metal layer 156 on the ferromagnetic layer 152. The output electrode 150 may further include an anti-ferromagnetic layer 154 between the ferromagnetic layer 152 and the metal layer 156.

A ferromagnetic material may be, for example, a NiFe alloy, CoFe alloy, CoFeB alloy, Fe, Co, Mn, and/or a permalloy. The ferromagnetic layers 142 and 152 may have up-spin electrons having higher DOS than that of the down-spin electrons. The up-spin electrons and the down-spin electrons of a general metal may have the same DOS and the source 130 may be a general metal. The anti-ferromagnetic layers 144 and 154 may be an anti-ferromagnetic material (e.g., FeMn, PtMn, and/or PtCrMn). The spin direction of the electrons in the drain 140 and the output electrode 150 may be dominant in different directions from each other.

The channel 120 may be, for example, a half-metal, a magnetic semiconductor and/or a ferromagnetic material. For example, the channel 120 may be a magnetic oxide (e.g., CrO2, Fe3O4, NiO, and/or TiO2), a magnetic double perovskite structure material, a magnetic Heusler alloy, a magnetic half Heusler alloy, and/or a semiconductor having half-metal characteristics. The magnetic double perovskite structure material may have, for example, a chemical composition represented as A2BB'O6, where A is selected from the group consisting of Ca, Sr, and Ba, B is a 3d-orbital transition metal such as Fe or Co, and B' is a 4d-orbital transition metal such as Mo or Re. Examples of the magnetic double perovskite structure material may include Sr2FeMoO6 and/or Sr2FeReO6.

The magnetic Heusler alloy may be at least one of the compositions X2YZ, X2YZ', X2Y'Z, X2Y'Z', where X is at least one of Co, Fe, and Ru, Y is at least one of Cr and Mn, and Z is at least one of Si, Ge, Sn, Al, Ga, Sb, and Pb. Examples of the magnetic Heusler alloy may include Co2CrAl and/or Co2MnSi. The magnetic half-Heusler alloy may be at least one of NiMnSb, PdMnSb, PtMnSb, CoMnSb, IrMnSb, NiCrSb, FeMnSb, CoCrSb, NiVSb, CoVSb, CoTiSb, NiMnSe, NiMnTe, CoFeSb, NiFeSb, and/or RhMnSb. The semiconductor having half-metal characteristics may be at least one of CrAs, MnAs, and/or CrSe.

The channel 120 may be a dilute magnetic semiconductor material that is magnetic after doping a transition metal on a semiconductor. The dilute magnetic semiconductor may be at least one of (In,Mn)As, (Ga,Mn)As, (Zn,Co)O, (Zn,V)O, (Ga,Mn)N, (Ga,Cr)N, (Cd,Mn)GeP2, (Zn,Mn)GeP2, (Ti,Cr)O2, and/or (Zn,Cr)Se. In the parentheses, the fist listed material is a host and the second listed material is a doping material (or substituting material). Additionally, a maganite based semiconductor such as NiMnSb, La(1−x)AxMnO3 (A=Ca, Ba, Sr, 0.2<x<0.3) and a transition metal doped semiconductor such as Cu doped GaN also may have half-metal characteristics.

The channel 120 may be a path of spin electrons between the source 130 and the drain 140, and between the source 130 and the output electrode 150. The channel 120 may act as a filter that selectively transmits the spin electrons having a certain direction, for example, the up spin direction or the down spin direction, which ma be injected from the source 130. The channel 120 may be set to pass the spin electrons having the same direction as that of the spin electrons of the output electrode 150 or the drain 140. The spin direction of electrons that are to be transmitted through the channel 120 may be determined according to a gate voltage Vg applied to the gate electrode 110. When the gate voltage Vg applied to the gate electrode 110 is greater than a threshold voltage, the spin direction of the channel 120 may be inverted and the spin direction of the electrons being transmitted through the channel 120 may be changed. The tunnel barrier 122 may help the channel 120 filter out electrons having an undesired spin direction that enter the channel 120 and filters out the electrons having an undesired spin direction which pass from the channel 120 to the drain 140 or the output electrode 150.

The spin field effect logic device 100 illustrated in FIG. 1 may include a field effect transistor (FET). The half-metal may have down-spin electrons and/or up-spin electrons. One type of spin electron, having a gap to the Fermi level, may exhibit semiconductor characteristics, and another type of spin electron may have metal characteristics. The channel 120 may be selected so that an energy band gap exists with respect to a spin direction of the main and/or majority spin electrons in the drain 140.

Figure 2:
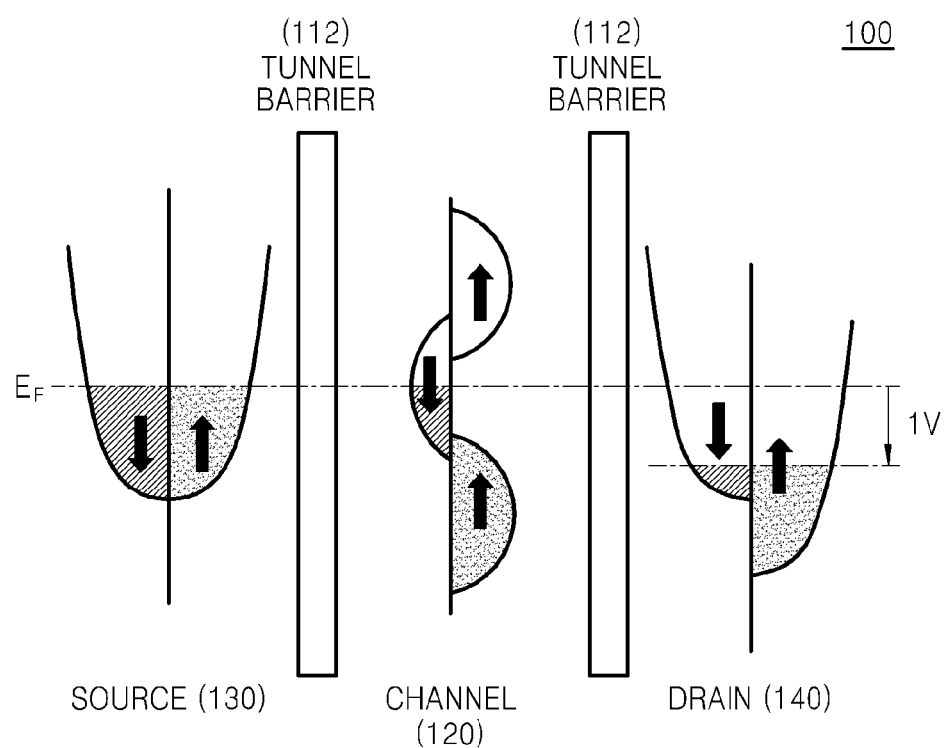

FIGS. 2-5 are diagrams illustrating driving principles of the logic device shown in FIG. 1. Referring to FIG. 2, when the source 130 is a general metal layer, the DOS of the up-spin electrons and the DOS of the down-spin electrons may be about equal to each other. The drain 140 may be selected so that the up-spin electrons are dominant in the drain 140. The channel 120 may selectively transmit the down-spin electrons because an energy band gap exists with respect to the up-spin electrons.

When a first voltage V1 (e.g., about 1V) is applied to the drain 140, the down-spin electrons from the source 130 may pass through the channel 120. Because the up-spin electrons are dominant in the drain 140, an electric current is decreased and/or rarely flows to the drain 140. Referring to FIG. 1, the spin of electrons in the channel 120 is in a direction denoted by an arrow A, and the spin direction of the electrons in the channel 120 and the spin direction of the electrons in the drain 140 may be anti-parallel with each other.

Figure 3:
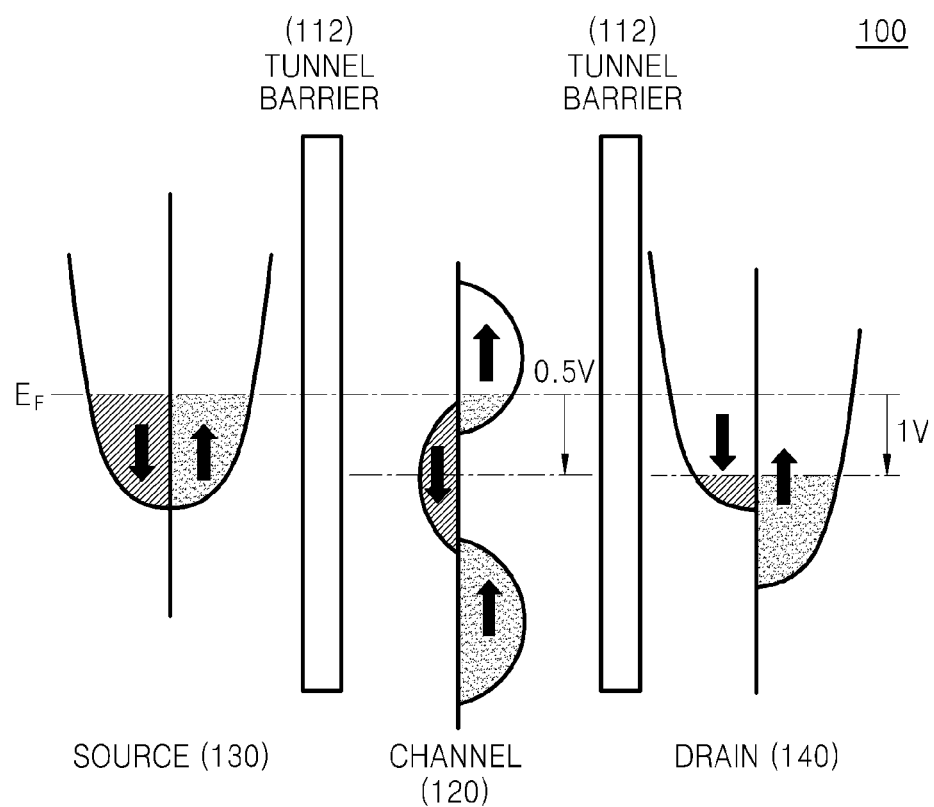

Referring to FIG. 3, when a threshold voltage (e.g., about 0.5V) is applied to the gate electrode 110, a conduction band of the up-spin electrons of the channel 120 may be aligned with the Fermi level $E_F$. Referring to FIG. 1, the spin direction of the electrons in the channel 120 may be in a direction denoted by an arrow B, and the spin direction of the electrons of the channel 120 and the spin direction of the electrons of the drain 140 may be parallel to each other. The up-spin electrons may be transmitted through the channel 120 and flow to the drain 140.

Figure 4:
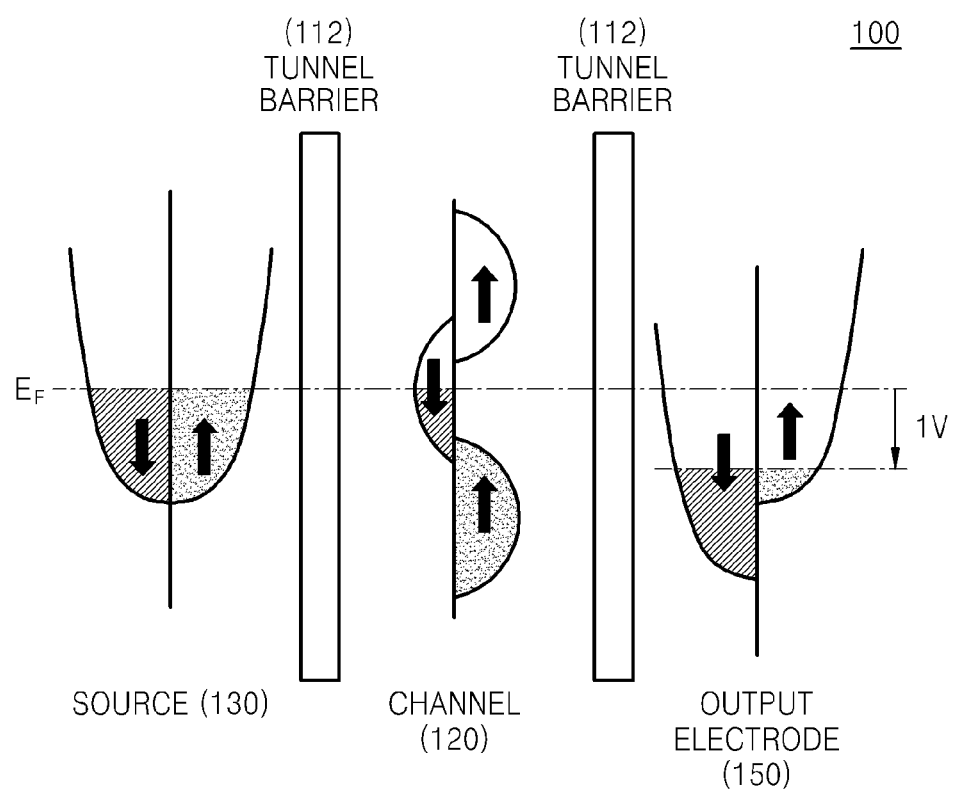
Figure 5:
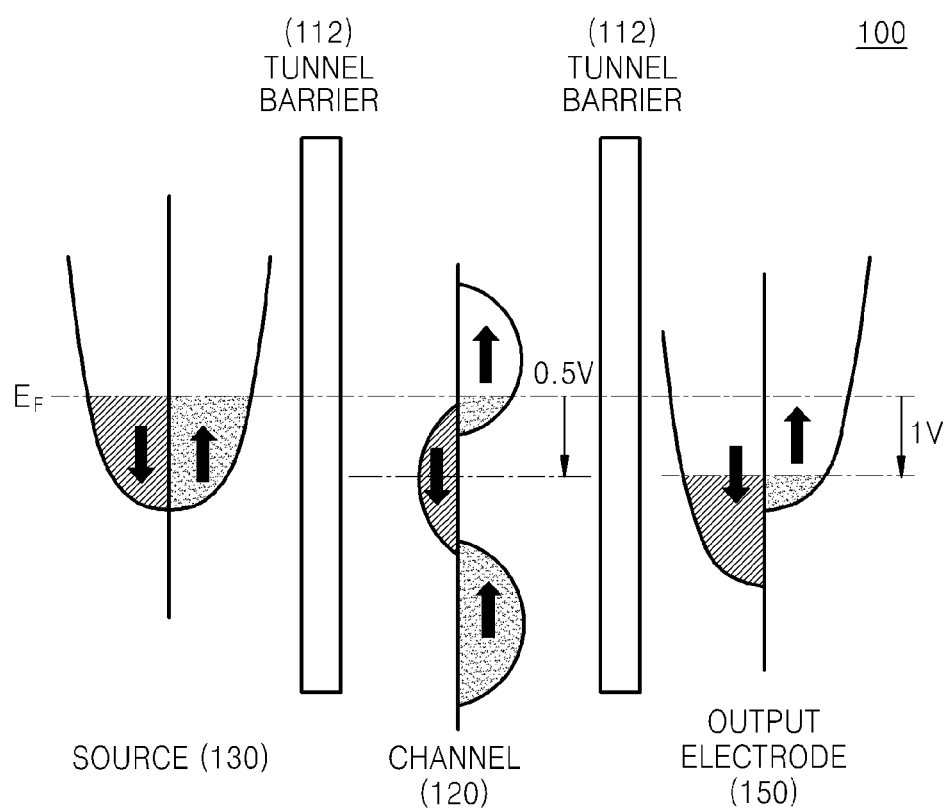

Referring to FIG. 4, the down-spin electrons may be dominant in the output electrode 150. In the channel 120, an energy band gap may exist with respect to the up-spin electrons so that the down-spin electrons may be selectively transmitted through the channel 120. When a second voltage V2 (e.g., about 1 V) is applied to the output electrode 150, the down-spin electrons from the source 130 may pass through the channel 120 and flow to the output electrode 150. Referring to FIG. 1, the spin direction of the electrons in the channel 120 is in the direction denoted by the arrow A. The electron spin direction of the channel 120 and the electron spin direction of the output electrode 150 may be in parallel with each other. Referring to FIG. 5, when a threshold voltage (e.g., about 0.5 V) is applied to the gate electrode 110, the conduction band of the up-spin electrons in the channel 120 may be aligned with the Fermi level $E_F$. Referring to FIG. 1, the spin direction of the electrons in the channel 120 are in the direction denoted by the arrow B. The electron spin direction of the channel 120 and the electron spin direction of the output electrode 150 are anti-parallel with each other. The up-spin electrons of the source 130 may be transmitted through the channel 120. The up-spin electron flow is decreased and/or rare to the output electrode 150, but up-spin electrons may flow to the drain 140. The current measured at the output electrode 150 may be low.

Figures 6, 7:
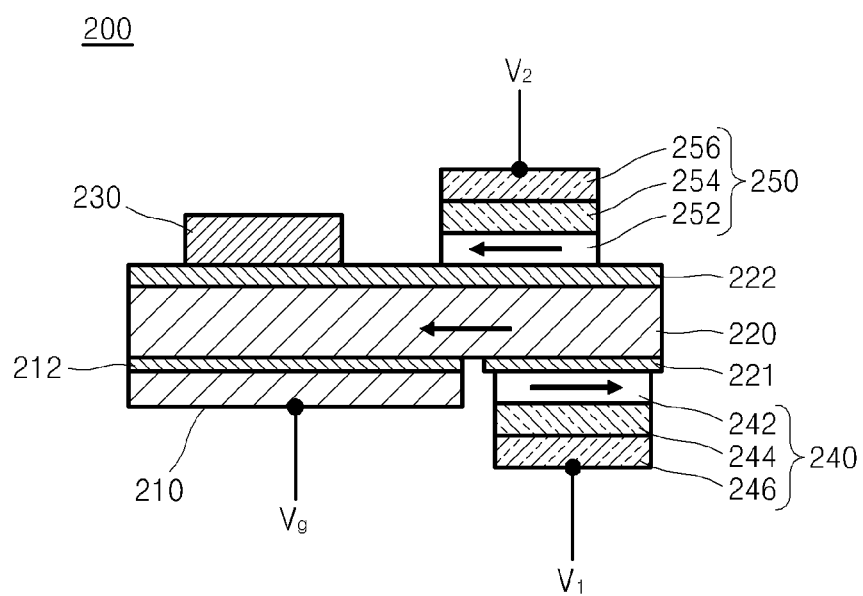

FIG. 6 is a truth table of the logic device shown in FIG. 1 illustrating inverter characteristics. The gate electrode 110 may be electrically connected to an input terminal and the output electrode 150 may be electrically connected to an output terminal. Electric current detected at the output electrode 150 is an output current ($I_{out}$). The output current $I_{out}$ is converted into an output voltage $V_{out}$ (shown in parenthesis). When a gate voltage Vg is greater than a threshold voltage $V_{th}$, the spin electrons from the source 130 in the channel 120 may become parallel with the spin electrons of the drain 140 and may flow to the drain 140. The output current $I_{out}$ detected from the output electrode 150 may be a relatively low and/or decreased current $I_{low}$. When the gate voltage Vg is lower than the threshold voltage $V_{th}$ (e.g., a ground voltage $V_0$) the spin electrons from the source 130 in the channel 120 may be parallel with the spin direction of the output electrode 150. The output current $I_{out}$ detected from the output electrode 150 may be an increased and/or relatively high current $I_{high}$. The logic device 100 of the present embodiment may be an inverter circuit device. The inverter logic device 100 may have an improved and/or simple structure.

FIG. 7 is a cross-sectional diagram of a spin field effect logic device that may be operated as an inverter according to an example embodiment. Referring to FIG. 7, a gate electrode 210 on a gate oxide 212 and a drain 240 on a first tunnel barrier 221 may be on a first surface of a channel 220. A second tunnel barrier 222 may be on a second surface of the channel 220. A source 230 and an output electrode 250 may be on the second tunnel barrier 222 and may be separated from each other. Locations of the drain 240 and the output electrode 250, and locations of the source 230 and the drain 240, may be different (e.g., swapped).

The gate electrode 210 may be a conductor (e.g., Al and/or polysilicon). The gate oxide 212 may be an oxide (e.g., silicon oxide). The first tunnel barrier 221 and the second tunnel barrier 222 may be the same as a material that is between both magnetization layers in a TMR device. For example, the first tunnel barrier 221 and the second tunnel barrier 222 may be MgO or AlOx (e.g., Al2O3). The source 230 may be a metal layer. When the source 230 is a general metal, densities of state (DOS) of an up-spin electron and a down-spin electron may be the same.

The drain 240 may be a magnetic material (e.g. a ferromagnetic material). The drain 240 may include a ferromagnetic layer 242 on the first tunnel barrier 221 and a metal layer 246 on the ferromagnetic layer 242. The drain 240 may further include an anti-ferromagnetic layer 244 between the ferromagnetic layer 242 and the metal layer 246. The anti-ferromagnetic layer 244 may fix a spin direction of spin-polarized electrons of the ferromagnetic layer 242. The output electrode 250 may be a magnetic material, for example, a ferromagnetic material. The output electrode 250 may include a ferromagnetic layer 252 on the second tunnel barrier 222 and a metal layer 256 on the ferromagnetic layer 252. The output electrode 250 may include an anti-ferromagnetic layer 254 between the ferromagnetic layer 252 and the metal layer 256.

The spin direction of the electrons in the drain 240 and the output electrode 250 may be dominant in different directions from each other. The channel 220 may be, for example, a half-metal. The spin field effect device 200 illustrated in FIG. 7 may include a field effect transistor. Operation of the spin field effect device 200 may be the same as operation of the spin field effect device 100 and detailed operational descriptions are omitted.

Figure 8:
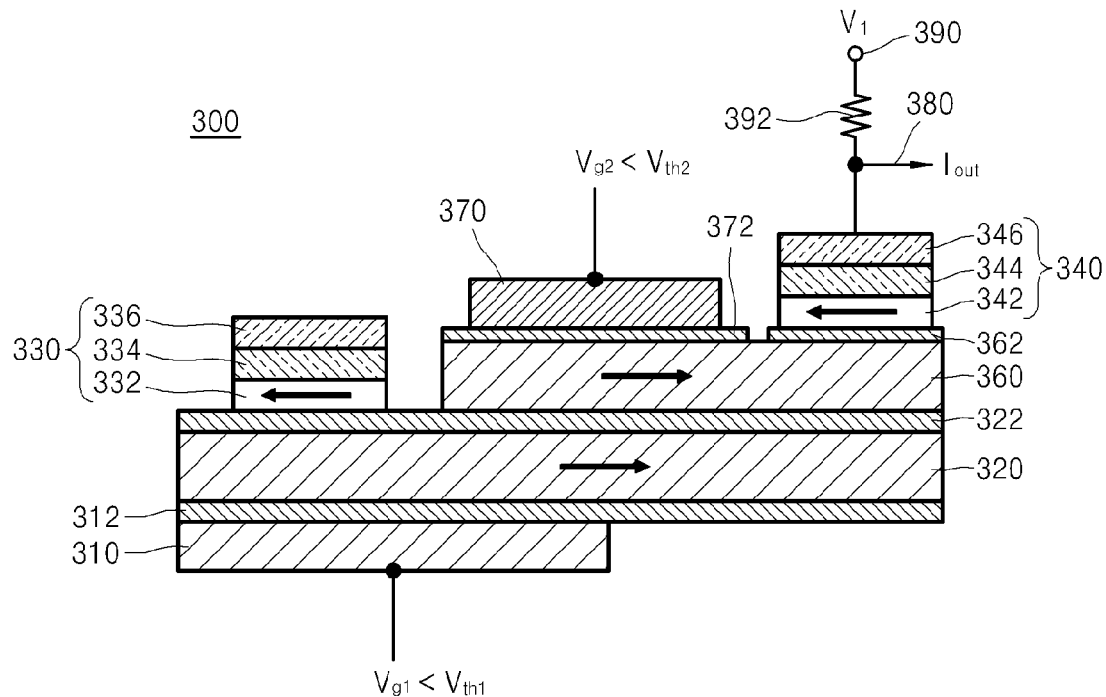
Figure 9:
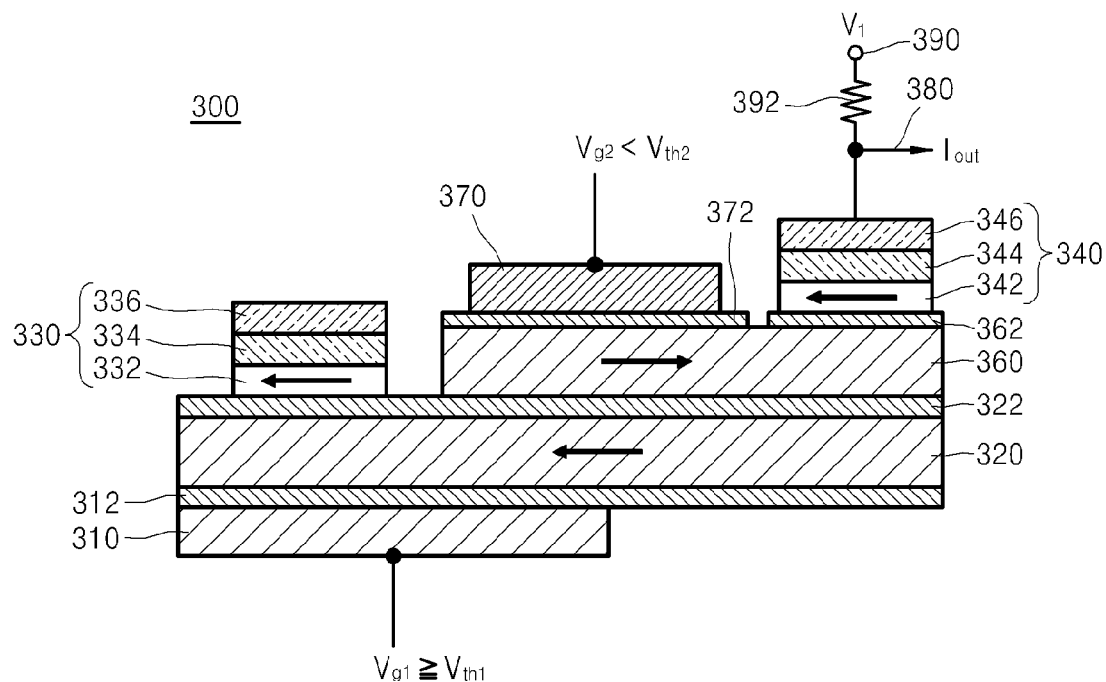
Figures 10, 11:
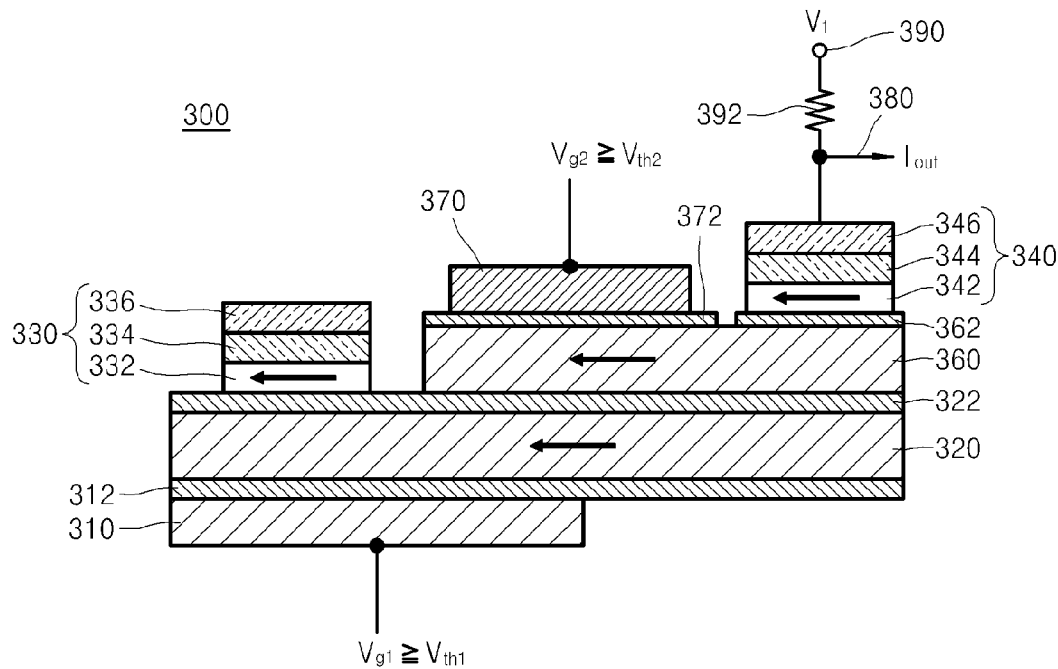

FIGS. 8-10 are cross-sectional diagrams of a spin field effect logic device 300 and illustrate NAND operation of the device according to an example embodiment. FIG. 11 is a truth table of the logic device shown in FIGS. 8-10 illustrating NAND characteristics. Referring to FIG. 8, a gate oxide 312 may be on a gate electrode 310, a first channel 320 may be on the gate oxide 312 and a first tunnel barrier 322 may be on the first channel 320. A source 330 and a second channel 360 may be on the first tunnel barrier 322 and may be separated from each other. A gate oxide 372 and a second tunnel barrier 362 may be on the second channel 360 and may be separated from each other. A second gate electrode 370 may be on the gate oxide 372 and a drain 340 may be on the second tunnel barrier 362.

A ground voltage may be applied to the source 330. A first voltage source 390 may be connected to the drain 340. An output line 380 may be connected between the drain 340 and the first voltage source 390. An output current $I_{out}$ flowing from the source 330 to the drain 340 may be measured at the output line 380. A first gate voltage $V_{g1}$ may be applied to the first gate electrode 310 and a second gate voltage $V_{g2}$ may be applied to the second gate electrode 370.

The source 330 may include a ferromagnetic layer 332, an anti-ferromagnetic layer 334 on the ferromagnetic layer 332, a metal layer 336 on the anti-ferromagnetic layer 334, and the ferromagnetic layer 332 on the first tunnel barrier 322. The drain 340 may include a ferromagnetic layer 342 on the second tunnel barrier 362, an anti-ferromagnetic layer 344 on the ferromagnetic layer 342, and a metal layer 346 on the ferromagnetic layer 344. The ferromagnetic layers 332 and 342 of the source 330 and the drain 340 may include main spin electrons which are magnetized in the same direction, for example, a first direction. The first channel 320 and the second channel 360 may be a half-metal that selectively transmits spin electrons magnetized in a second direction which is opposite to the first direction. When a threshold voltage $V_{th1}$ is applied to the first gate electrode 310, the first channel 320 may selectively transmit spin electrons magnetized in the first direction. When a second threshold voltage $V_{th2}$ is applied to the second gate electrode 370, the second channel 360 may selectively transmits spin electrons magnetized in the first direction. When a first voltage $V_1$ is applied between the source 330 and the drain 340, electrons injected from the source 330 may move to the drain 340 via the first channel 320 and the second channel 360.

A resistance between the source 330 and the drain 340 may be the sum of the resistances between the source 330 and the first channel 320 and between the drain 340 and the second channel 360. The resistance between the source 330 and the first channel 320 when the electron spin directions between the source 330 and the first channel 320 are anti-parallel with each other is a first resistance R1, and the resistance when the electron spin directions are parallel with each other is a second resistance R2. The resistance between the drain 340 and the second channel 360 when the electron spin directions between the drain 340 and the second channel 360 are anti-parallel with each other is a third resistance R3, and the resistance when the electron spin directions are parallel with each other is a fourth resistance R4. The first resistance R1 may be greater than the second resistance R2. The third resistance R3 may greater than the fourth resistance R4. A resistance 392 of the first voltage source 390 may be greater than a sum of the second resistance R2 and the fourth resistance R4, and smaller than a sum of the first resistance R1 and the fourth resistance R4 or a sum of the second resistance R2 and the third resistance R3.

Referring to FIG. 8, a first voltage $V_1$ (e.g., 1V) may be applied between the source 330 and the drain 340, and a ground voltage may applied to the first and second gate electrodes 310 and 370. Because the resistance between the source 330 and the drain 340 is the sum of the first and third resistances R1 and R3, which is greater than the resistance 392 of the first voltage source 390, a first electric current flowing from the source 330 to the drain 340 may lower than a second electric current flowing from the first voltage source 390, and the electric current detected at the output line 380 may be the second current from the first voltage $V_1$. Referring to FIG. 11, the first and second gate electrodes 310 and 370 may be electrically connected to first and second input terminals respectively, and the output line 380 may be electrically connected to an output terminal. First input voltage $V_{input1}$ and second input voltage $V_{input2}$ may be a low voltage $V_{low}$, and output voltage $V_{output}$ may become high voltage $V_{high}$.

When a first gate voltage $V_{g1}$ that is greater than the first threshold voltage $V_{th1}$ is applied to the first gate electrode 310, the spin direction of the first channel 320 may be inverted as shown in FIG. 9. The resistance between the source 330 and the drain 340 may be the sum of the second resistance R2 and the third resistance R3, which is greater than the resistance 392. A second electric current may be detected at the output line 380 that is a high electric current. Referring to FIG. 11, the first input voltage $V_{input1}$ may be a high voltage $V_{high}$ and the second input voltage $V_{input2}$ may be a low voltage $V_{low}$, and the output voltage $V_{output}$ may become high voltage $V_{high}$.

When the ground voltage is applied to the first gate electrode 310 and the second gate voltage $V_{g2}$ that is greater than the second threshold voltage $V_{th2}$ is applied to the second gate electrode 370 (not shown), the spin direction of the second channel 360 may be inverted. The resistance between the source 330 and the drain 340 may be the sum of the first resistance R1 and the fourth resistance R4, which may be greater than the resistance 392. The second electric current may be detected at the output line 380 that is a high electric current. Referring to FIG. 11, the first input voltage $V_{input1}$ may be a low voltage $V_{low}$ and the second input voltage may be a high voltage $V_{high}$, and the output voltage $V_{output}$ may become high voltage $V_{high}$.

Referring to FIG. 10, the first gate voltage $V_{g1}$ that is greater than the first threshold voltage $V_{th1}$ may be applied to the first gate electrode 310 and the second gate voltage $V_{g2}$ that is greater than the second threshold voltage $V_{th2}$ may be applied to the second gate electrode. The spin direction of the electrons being transmitted through the first channel 320 and the second channel 360 may be parallel with that of the main spin electrons of the source 330 and the drain 340. The resistance between the source 330 and the drain 340 may be the sum of the second and fourth resistances R2 and R4, which is lower than the resistance 392, and the first electric current flowing from the source 330 to the drain 340 may be detected at the output line 380. The first electric current ($I_{low}$) may be higher than the second electric current. Referring to FIG. 11, the first input voltage $V_{input1}$ may be a high voltage $V_{high}$ and the second input voltage $V_{input2}$ may be a high voltage $V_{high}$, and the output voltage $V_{output}$ may become low voltage $V_{low}$.

The first and second gate electrodes 310 and 370 may be electrically connected to first and second input terminals respectively, the output line 380 may be electrically connected to an output terminal, and a truth table, as illustrated in FIG. 11, may be obtained. Operations of the NAND logic device 300 illustrated in FIG. 8 may be provided.

Figure 12:
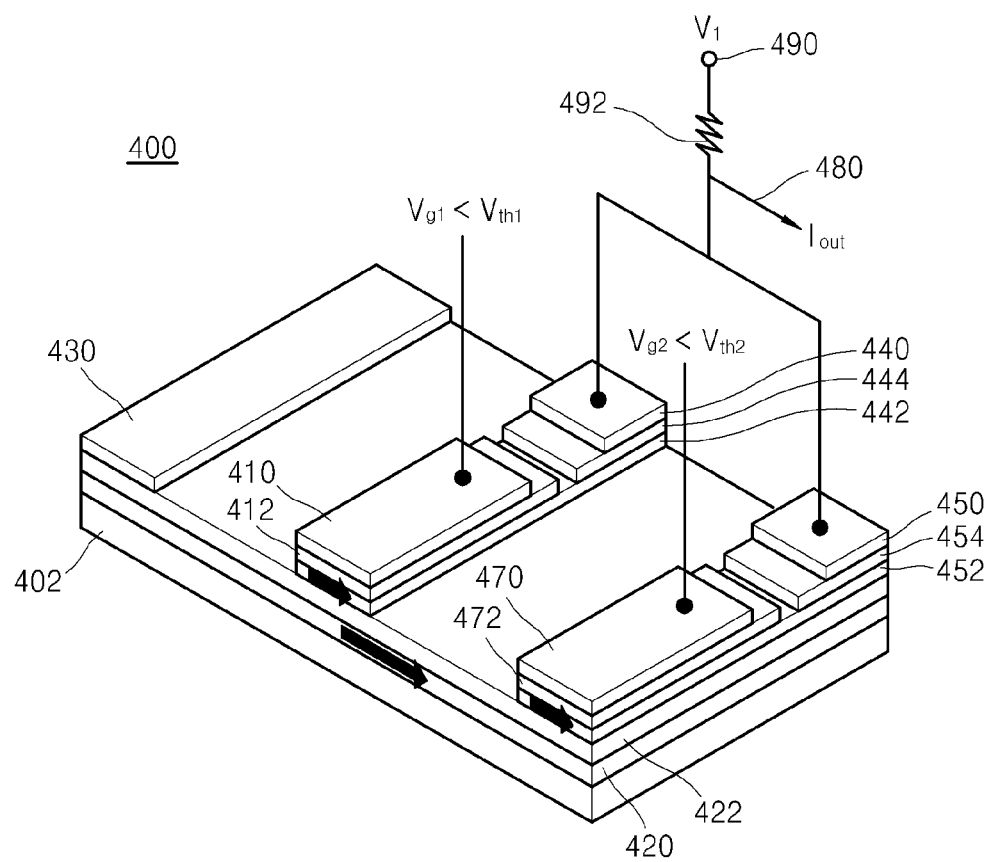
Figure 13:
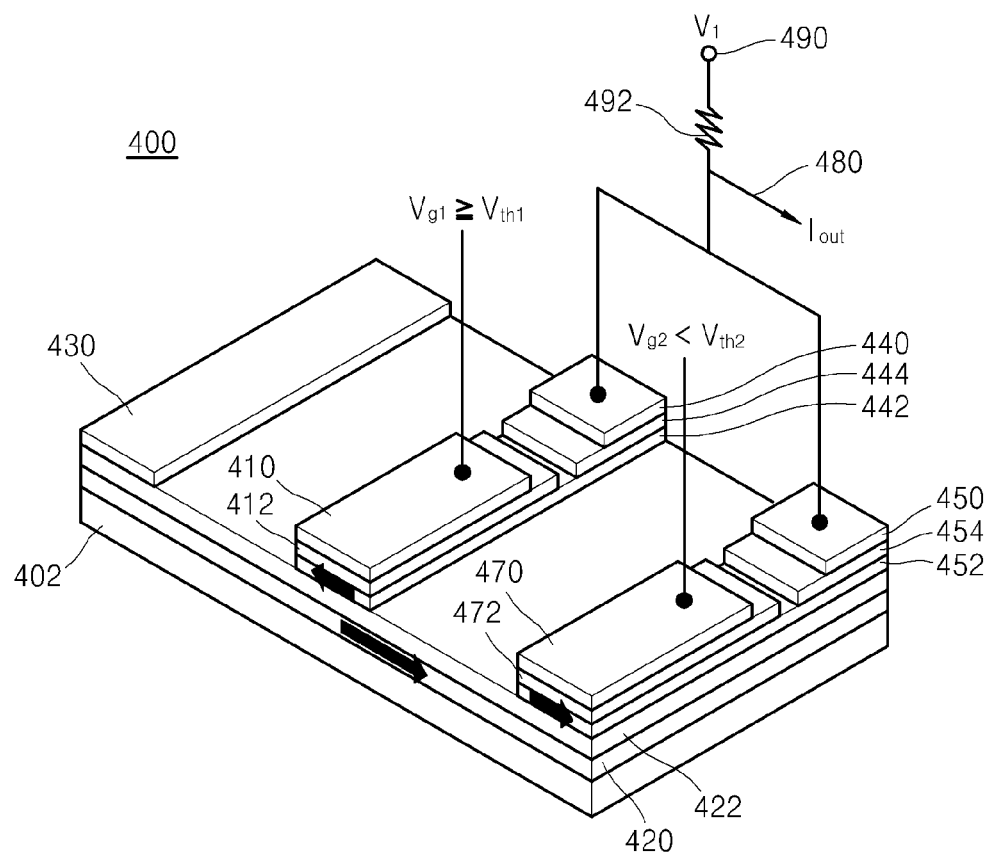
Figures 14, 15:
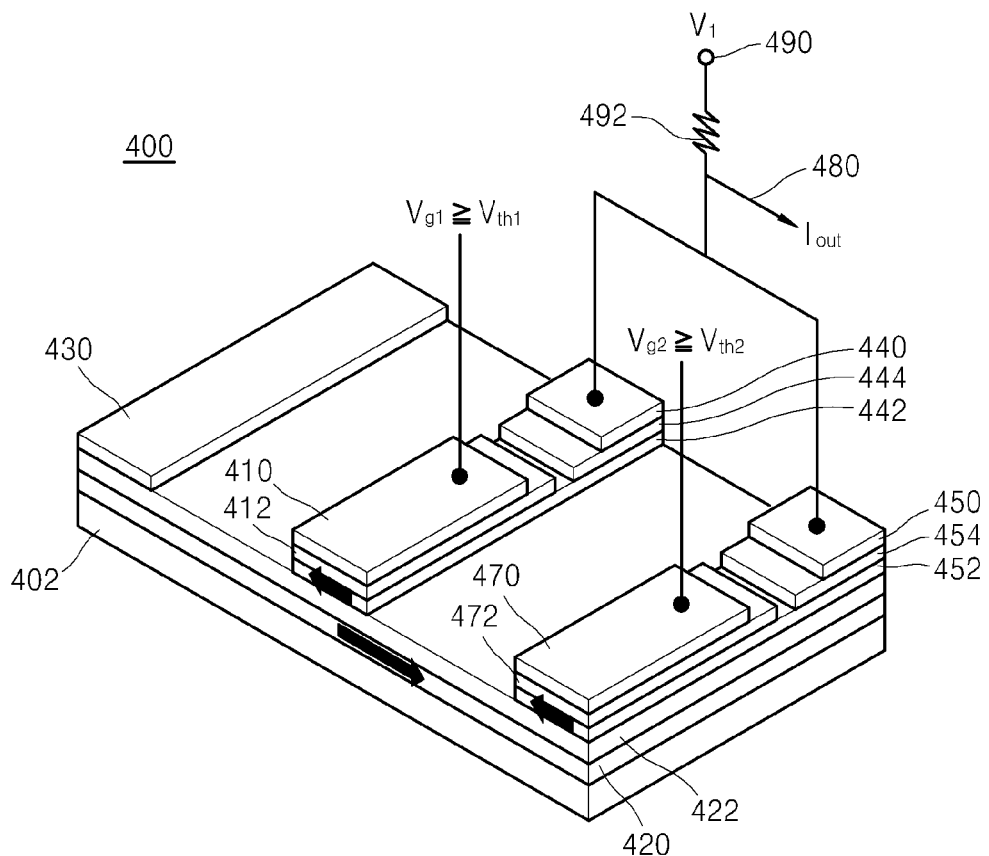

FIGS. 12-14 are perspective diagrams of a spin field effect logic device 400 and illustrate AND operation of the device according to an example embodiment.

FIG. 15 is a truth table of the logic device of FIGS. 12-14 illustrating AND characteristics. Referring to FIG. 12, a first channel 420 and a first tunnel barrier 422 may be on an insulating substrate 402. A source 430, a second channel 442 and a third channel 452 may be on the first tunnel barrier 422. A second tunnel barrier 444 and a first gate oxide 412 may be on the second channel 442. A first drain 440 may be on the second tunnel barrier 444. A first gate electrode 410 may be on the first gate oxide 412. A third tunnel barrier 454 and a second gate oxide 472 may be on the third channel 452. A second drain 450 may be on the third tunnel barrier 454. A second gate electrode 470 may be on the second gate oxide 472. A first voltage source 490 may be connected between the first drain 440 and the second drain 450 in parallel. An output line 480 may be connected between the first voltage source 490 and the first drain 440. Reference numeral 492 may denote a resistance between the first voltage source 490 and the output line 480. When the measured current at the output line 480 is a current from the source 430, the measured current may be a first current. When the measured current at the output line 480 is a current from the first voltage source 490, the measured current may be a second current.

When the spin direction of the second channel 442 or the spin direction of the third channel 452 is parallel with the spin direction of the first channel 420, the resistance between the first channel 420 and the channel 442 or 452 may be a first resistance. When the spin direction of the second channel 442 and the spin direction of the third channel 452 is anti-parallel with the spin direction of the first channel 420, the resistance between the first channel 420 and the channel 442 and 452 may be a second resistance. The first current may be set to be lower than the second current. The first channel 420 may be a half-metal and may be magnetized so as to transmit spin electrons in a first direction. The second channel 442 and the third channel 452 may transmit spin electrons having the first direction. Operations of the logic device will now be described with reference to FIGS. 12-15.

Referring to FIGS. 12 and 15, when a ground voltage is applied to the source 430 and a ground voltage $V_o$ or $V_{low}$ is applied to the first gate electrode 410 and the second gate electrode 470, and a first voltage $V_1$ is applied to the first voltage source 490, electrons from the source 430 may be transmitted through the channels 420, 442, and 452 and flow to the drains 440 and 450. When the source 430 is a general metal, the amount of spin electrons having the first direction and the amount of spin electrons having the second direction may be about equal to each other. The spin electrons having the first direction may flow to the first drain 440 and the second drain 450 via the channels 420, 442, and 452, and flow to the output line 480. The first current (low current $I_{low}$) may be detected at the output line 480. The output line 480 may be referred to as an output electrode.

When a first gate voltage $V_{g1}$ that is greater than the first threshold voltage $V_{th1}$ is applied to the first gate electrode 410, the direction of spin electrons of the second channel 442 may become anti-parallel with the direction of spin electrons of the first channel 420 as shown in FIG. 13. The direction of the spin electrons of the third channel 452 may be in parallel with that of the spin electrons of the first channel 420. When the first voltage $V_1$ is applied to the first voltage source 490, the spin electrons having the first direction from the source 430 may flow to the second drain 450 via the third channel 452 having a low resistance and the first current may be detected at the output line 480. Conversely, when a second gate voltage $V_{g2}$ which is greater than the second threshold voltage $V_{th2}$ is applied to the second gate electrode 470 and the ground voltage is applied to the first gate electrode 410 (not shown), the spin electrons having the first direction from the source 430 may flow to the first drain 440 via the second channel 442 having a low resistance, and the first current may be detected at the output line 480.

Referring to FIG. 14, when the first threshold voltage $V_{th1}$ and the second threshold voltage $V_{th2}$ are respectively applied to the first gate electrode 410 and the second gate electrode 470, the spin electrons having the first direction may not flow in the first and second channels 442 and 452. The electric current from the first voltage source 490 may flow to the output line 480, and the second current may be detected. The second current may be greater than the first current.

Referring to FIG. 15, the first and second gate electrodes 410 and 470 may be electrically connected to the first and second input terminals, the output line 480 may be electrically connected to the output terminal, and a truth table, as illustrated in FIG. 15, may be obtained. Operation of the AND logic device 400 illustrated in FIG. 12 may be provided.

Figure 16:
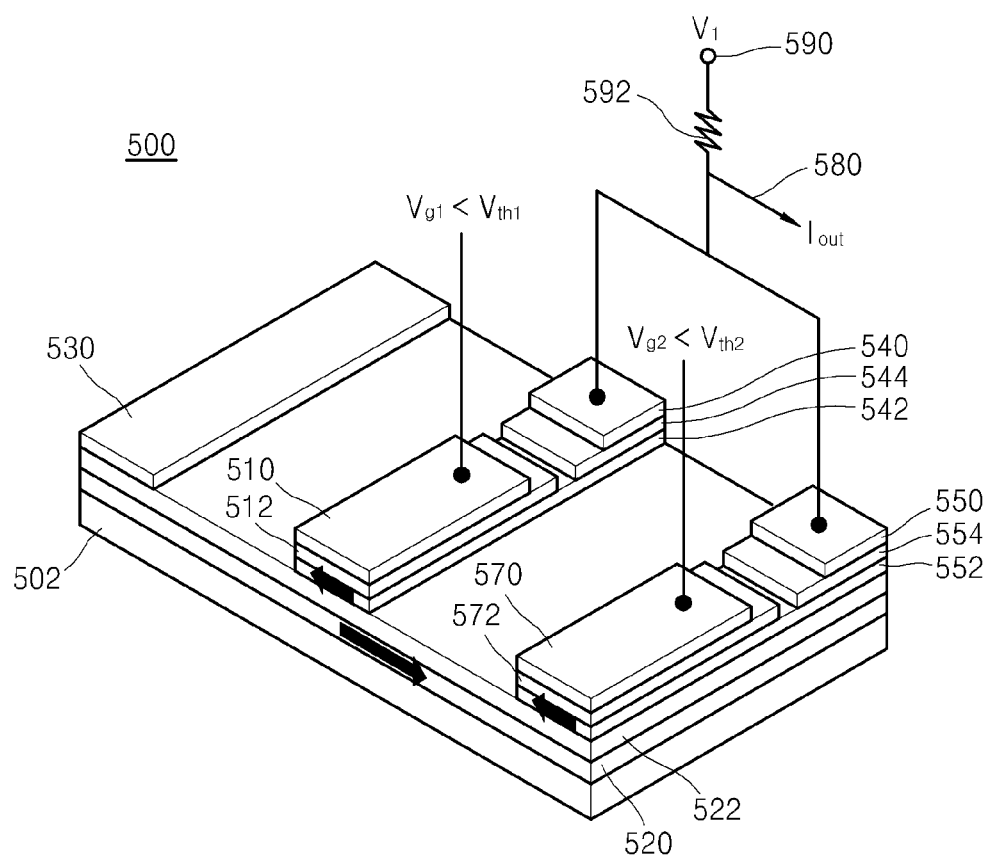
Figure 17:
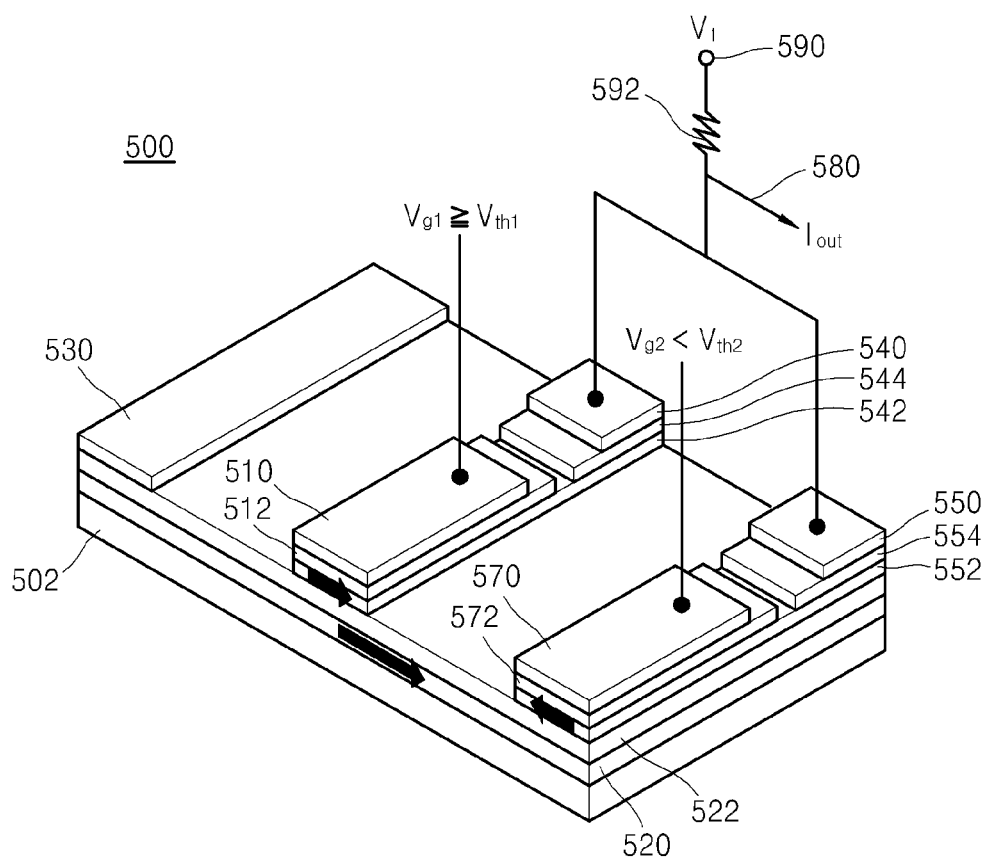
Figures 18, 19:
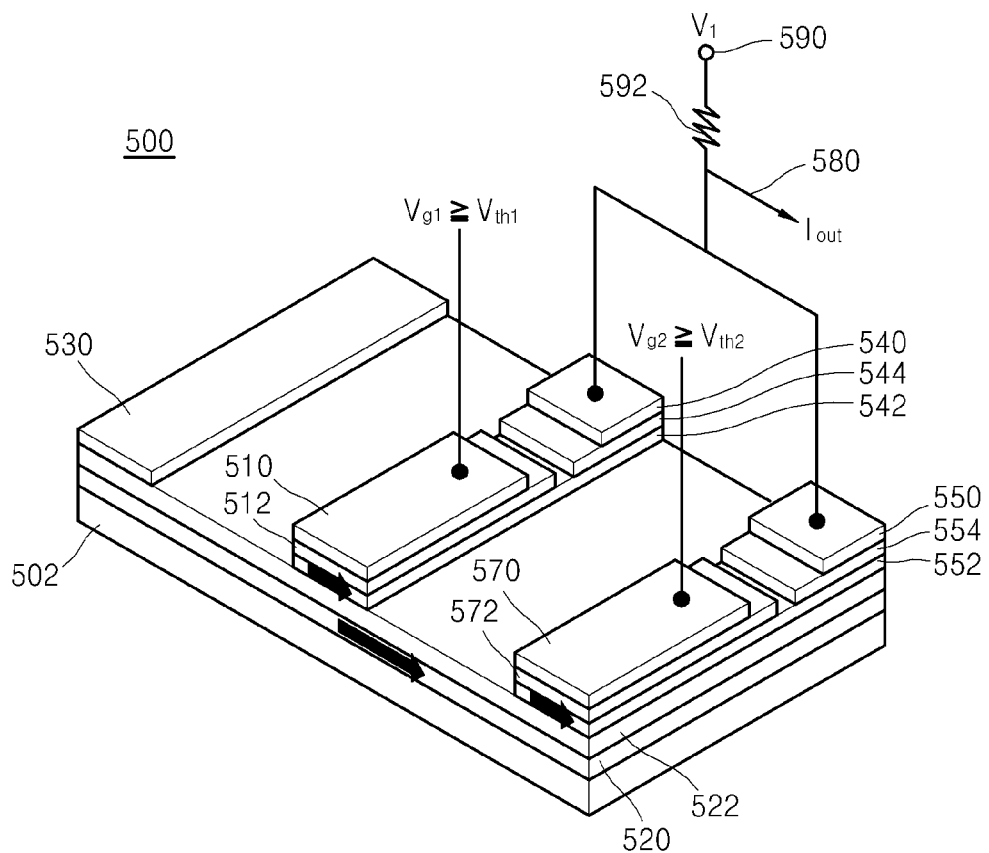

FIGS. 16-18 are perspective diagrams of a spin field effect logic device 500 and illustrate NOR operation of the device according to an example embodiment. FIG. 19 is a truth table of the logic device of FIGS. 16-18 illustrating NOR characteristics. Referring to FIG. 16, a first tunnel barrier 522 may be on a first channel 520 and the first channel 520 may be on an insulating substrate 502. A source 530, a second channel 542 and a third channel 552 may be on the first tunnel barrier 522. A second tunnel barrier 544 and a first gate oxide 512 may be on the second channel 542. A first drain 540 may be on the second tunnel barrier 544. A first gate electrode 510 may be on the first gate oxide 512. A third tunnel barrier 554 and a second gate oxide 572 may be on the third channel 552. A second drain 550 may be on the third tunnel barrier 554. A second gate electrode 570 may be on the second gate oxide 572. A first voltage source 590 may be connected between the first drain 540 and the second drain 550 in parallel. An output line 580 may be connected between the first voltage source 590 and the first drain 540. Reference numeral 592 may denote a resistance between the first voltage source 590 and the output line 580. When the measured current at the output line 580 is a current from the source 530, the measured current may be a first current. When the measured current at the output line 580 is a current from the first voltage source 590, the measured current may be a second current.

When the spin direction of the second channel 542 and the spin direction of the third channel 552 are anti-parallel with the spin direction of the first channel 520, the resistance between the first channel 520 and the channel 542 or 552 is a first resistance. When the spin direction of the second channel 542 or the spin direction of the third channel 552 is parallel with the spin direction of the first channel 520, the resistance between the first channel 520 and the channels 542 or 552 may be a second resistance. The first current may lower than the second current. The first channel 520 may be a half-metal and may be magnetized so as to transmit spin electrons in a first direction. The second channel 542 and the third channel 552 are formed to transmit the spin electrons having the second direction.

Operations of the logic circuit device 500 illustrated in FIG. 16-18 will now be described with reference to the FIGS. 16-19. Referring to FIGS. 16 and 19, when a ground voltage is applied to the source 530 and a ground voltage $V_o$ or $V_{low}$, is applied to the first gate electrode 510 and the second gate electrode 570 and a first voltage $V_1$ is applied to the first voltage source 590, electrons from the source 530 may be transmitted through the channels 520, 542, and 552 and flow to the first and second drains 540 and 550. When the source 530 is a general metal, the amount of spin electrons having the first direction and the amount of spin electrons having the second direction may be about equal to each other. Since the spin electrons having the first channel 520 are anti-parallel with the spin electrons of the second channel 542 and the third channel 552, a resistance between the source 530 and the drains 540 and 550 may be greater than the resistance 592. The second current from the first voltage source 590 may be detected at the output line 580.

When a first gate voltage $V_{g1}$ which is greater than the first threshold voltage $V_{th1}$ is applied to the first gate electrode 510, the direction of spin electrons of the second channel 542 may become parallel with the direction of spin electrons of the first channel 520 as shown in FIG. 17. When the first voltage $V_1$ is applied to the first voltage source 590, the spin electrons having the first direction from the source 530 may flow to the first drain 540 via the second channel 542 having a low resistance, and the first current may be detected at the output line 580. The first current may be lower than the second current. When a second gate voltage $V_{g2}$ which is greater than the second threshold voltage $V_{th2}$ is applied to the second gate electrode 570 and the ground voltage is applied to the first gate electrode 510 (not shown), the spin electrons having the first direction from the source 530 may flow to the second drain 550 via the third channel 552 having a low resistance, and the first current may be detected at the output line 580.

Referring to FIG. 18, when the first threshold voltage $V_{th1}$ and the second threshold voltage $V_{th2}$ are respectively applied to the first gate electrode 510 and the second gate electrode 570, the spin electrons having the first direction may flow in the first and second channels 542 and 552, and the first current may be detected at the output line 580. Referring to FIG. 19, the first and second gate electrodes 510 and 570 may be electrically connected to the first and second input terminals, the output line 580 may be electrically connected to the output terminal, and a truth table, as illustrated in FIG. 19, may be obtained. Operation of the NOR logic device 500 illustrated in FIG. 16 may be provided.

Figure 20:
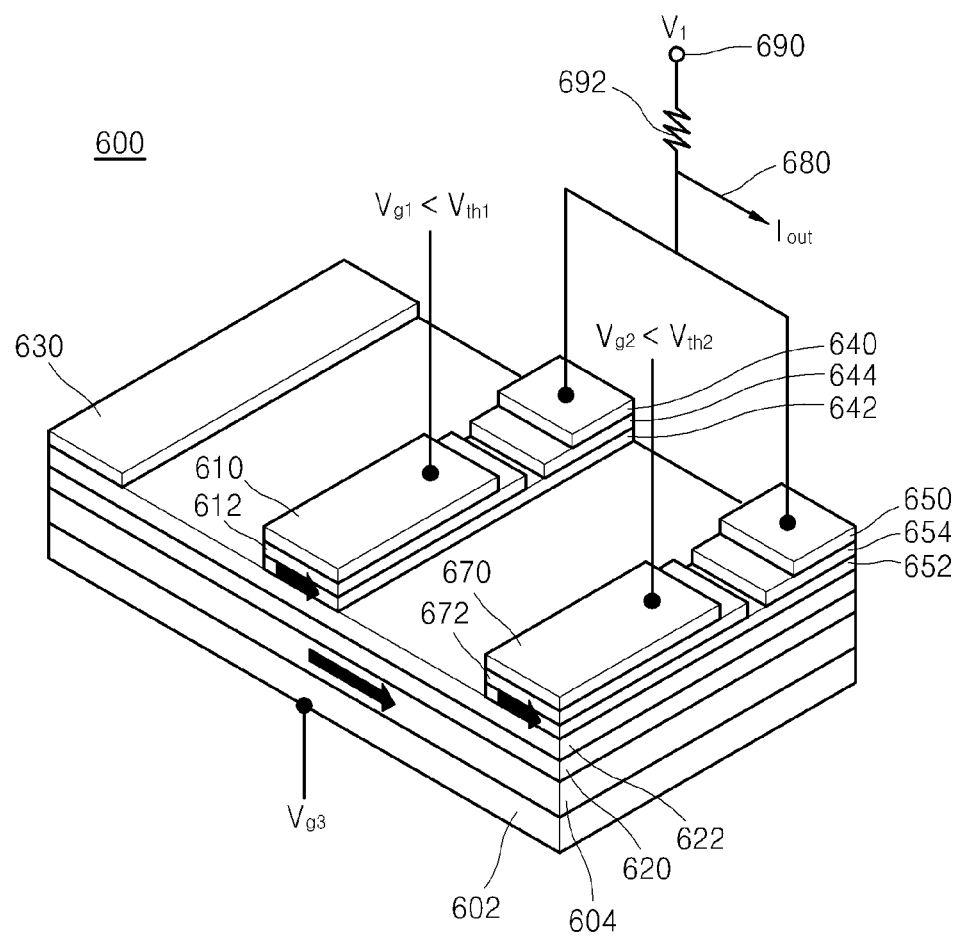

FIG. 20 is a perspective diagram of a spin field effect logic device and illustrates AND and NOR operation of the device according to an example embodiment. Referring to FIG. 20, a third gate oxide 604 may be on a control gate 602. A first channel 620 may be on the third gate oxide 604 and a first tunnel barrier 622 may be on the first channel 620. A source 630, a second channel 642, and a third channel 652 may be on the first tunnel barrier 622. A second tunnel barrier 644 and a first gate oxide 612 may be on the second channel 642. A first drain 640 may be on the second tunnel barrier 644. A first gate electrode 610 may be on the first gate oxide 612. A third tunnel barrier 654 and a second gate oxide 672 may be on the third channel 652. A second drain 650 is formed on the third tunnel barrier 654. A second gate electrode 670 is formed on the second gate oxide 672. A first voltage source 690 may be connected to the first and second drain 640 and 650 in parallel. An output line 680 may be connected between the first voltage source 690 and the first drain 640. Reference numeral 692 may denote a resistance between the first voltage source 690 and the output line 680.

The first channel 620 may be a half-metal, and may be magnetized so as to transmit spin electrons in a first direction. The second channel 642 and the third channel 652 may transmit the spin electrons having the first direction. A third gate voltage $V_{g3}$ which is greater than a third threshold voltage may be applied to the control gate 602. The direction of spin electrons of the first channel 620 may be inverted to transmit the spin electrons having the second direction. The first channel 620 may be anti-parallel with the second channel 642 and the third channel 652. The logic device 600 may become a NOR logic device that is the same as logic device 500 illustrated in FIG. 16. When a third gate voltage $V_{g3}$ which is smaller than the third threshold voltage is applied to the control gate 602, the first channel 620 may be parallel with the second channel 642 and the third channel 652. The logic device 600 may become an AND logic device that is the same as the logic device 400 illustrated in FIG. 12. The logic device 600 may be convertible between an AND logic device and a NOR logic device according to the third gate voltage Vg3.

While example embodiments have been particularly shown and described, it will be understood by one of ordinary skill in the art that variations in form and detail may be made therein without departing from the spirit and scope of the claims.

What is claimed is:

1. A spin field effect logic device comprising:
   a channel including a magnetic material configured to selectively transmit spin-polarized electrons;
   a source on the channel;
   a gate electrode on the channel;
   a drain electrode configured to output electrons transmitted from the source;
   an output electrode configured to output electrons transmitted from the source;
   a first voltage source connected to the drain;
   a second channel on the channel, the drain on the second channel; and
   a second gate electrode on the second channel,
   wherein the source is on the channel,
   the output electrode is connected between the drain and the first voltage source,
   the source and the drain are magnetized in a first direction,
   the gate and the second gate electrodes are configured to control a magnetization state of the channel and the second channel respectively, in order to selectively transmit electrons injected from the source into the channel, and the channel and the second channel transmit the spin-polarized electrons which are magnetized in a second direction, and wherein the logic device is configured such that when at least one of the channel and the second channel is magnetized in the second direction, a resistance between the source and the output electrode is a first resistance, when both the channel and the second channel are magnetized in the first direction, the resistance is a second resistance, and a resistance between the first voltage source and the output electrode is a third resistance having a magnitude between that of the first resistance and the second resistance.

2. The logic device of claim 1, further comprising:
a first input terminal connected to the first gate electrode;
a second input terminal connected to the second gate electrode; and
an output terminal connected to the output electrode,
wherein the logic device is configured such that when each of the first and second input terminals has a potential about greater than or equal to a corresponding threshold voltage, the channel and the second channel transmit the electrons spin-polarized in the first direction and a first voltage related to a first current from the source is output at the output terminal, when at least one of the first and second input terminals has a potential which is smaller than the corresponding threshold voltage, a second voltage related to a second current from the first voltage source is output, and the second voltage is greater than the first voltage.

3. The logic device of claim 1, further comprising:
a first tunnel barrier between the channel and the source, and between the channel and the second channel; and
a second tunnel barrier between the second channel and the drain, and between the second channel and the output electrode.

4. The logic device of claim 3, wherein the channel and the second channel are a half-metal.

5. The logic device of claim 4, wherein each of the source and the drain includes a ferromagnetic layer on the first and second tunnel barrier, respectively, and a metal layer formed on the ferromagnetic layer.

* * * * *